United States Patent [19]

Takahashi

[11] Patent Number: 4,948,995
[45] Date of Patent: Aug. 14, 1990

[54] DISENABLING CIRCUIT FOR POWER-ON EVENT

[75] Inventor: Yasunao Takahashi, Tokyo, Japan

[73] Assignee: NEC Corporation, Tokyo, Japan

[21] Appl. No.: 267,817

[22] Filed: Nov. 7, 1988

[30] Foreign Application Priority Data

Nov. 6, 1987 [JP] Japan .................. 62-281453

[51] Int. Cl.$^5$ .................. H03K 5/153; H03K 17/22; H03K 17/284
[52] U.S. Cl. .................. 307/594; 307/272.3; 307/296.5; 307/350; 307/443
[58] Field of Search .................. 307/443, 296.5, 304, 307/592, 594, 597, 350, 354, 362, 363, 451, 584, 585, 602, 603, 605, 264,

[56] References Cited

U.S. PATENT DOCUMENTS

| H 497 | 7/1988 | Piasecki | 307/594 |
| 4,045,688 | 8/1977 | Stewart | 307/594 |
| 4,633,107 | 12/1986 | Norsworthy | 307/592 |
| 4,709,165 | 11/1987 | Higuchi et al. | 307/296.5 |
| 4,716,323 | 12/1987 | Wada et al. | 307/594 |

FOREIGN PATENT DOCUMENTS 1272496  11/1986  U.S.S.R. .................. 307/296.5

Primary Examiner—Timothy P. Callahan
Attorney, Agent, or Firm—Helfgott & Karas

[57] ABSTRACT

A disenabling circuit upon a power-on event comprises a level detecting circuit provided with a series combination of plural p-channel type load transistors and at least one n-channel type shifting transistor coupled between a positive power supplying line and a ground terminal, and a complementary inverter circuit coupled at an input node thereof to the output node of the level detecting circuit and having an output node where a disenabling signal of active high level is produced. The shifting transistor is responsive to the voltage level at the output node of the complementary inverter circuit, so that no conduction path takes place in the level shifting circuit after the disenabling signal recovers from the active level to the inactive low level.

3 Claims, 5 Drawing Sheets

PRIOR-ART

DISENABLING CIRCUIT FOR POWER-ON EVENT

FIELD OF THE INVENTION

This invention relates to a disenabling circuit and, more particularly, to a disenabling circuit operative to prohibit controlling circuits incorporated in an integrated circuit from an unstable operations

BACKGROUND OF THE INVENTION

In general, an integrated circuit for digital operations is equipped with a control signal producing circuit for sequential functions of the component circuits, and a source of voltage is shared by the control signal producing circuit and the component circuits. When the integrated circuit incorporated in an electronic system is activated upon a power switch-on event, the source of voltage is unstable in voltage level, so that the control signals are irregularly produced by the control signal producing circuit These irregular control signals mislead the sequential functions of the component circuits, which sometimes results in serious problems in the integrated circuit For example, data output terminals are provided in association with wired-OR gates, respectively, which are supplied with one of the control signals such as an enable signal In this arrangement, if the control signal is stable, conduction paths are liable to take place in the wired-OR gates and, for this reason, a large amount of current flows into the ground terminal, thereby causing the electronic system to fall into failure. For preventing the integrated circuit from the consumption of a large amount of current, a disenabling circuit is provided in the integrated circuit, and the disenabling circuit is operative to cause the component circuits to stay in the inactive states until the source of voltage reaches the stable state.

Referring to FIG. 1 of the drawings, there is shown a prior- o art disenabling circuit which comprises a level detecting circuit 1 provided with a series combination of two p-channel type field effect transistors 2 and 3 and an n-channel type field effect transistor 4 coupled between a positive voltage line 5 coupled to a power switch (not shown) and a ground terminal, and an complementary inverter circuit 6 provided with a series combination of a p-channel type field effect transistor 7 and an n-channel type field effect transistor 8 coupled between the positive voltage line 5 and the ground terminal. When an integrated circuit remains in the stable state, the positive voltage line 5 supplies all of the circuits incorporated in the integrated circuit with a positive voltage level Vcc. The level detecting circuit 1 has an output node N1 coupled between the field effect transistors 3 and 4, and an output node N2 of the inverter circuit 6 is provided between the p-channel type field effect transistor 7 and the n-channel type field effect transistor 8. A power-on disenable signal DE takes place at the output node N2 which is supplied to the component circuits. Each of the p-channel type field effect transistors 2 and 3 has a gate electrode coupled to a drain node thereof, and a gate electrode of the n-channel type field effect transistor 4 is coupled to the positive voltage line 5. The drain node of the p-channel type field effect transistor 2 is hereinunder referred to as a node N3. The p-channel type field effect transistors 2 and 3 have respective current driving capabilities ten times larger than the n-channel type field effect transistor 4 but respective threshold levels approximately equal in absolute value to the threshold level Vth of the n-channel type field effect transistor 4. Similarly, the p-channel type field effect transistor 7 has a threshold voltage level approximately equal in absolute value to the threshold voltage level Vth of the n-channel type field effect transistor 8.

Description is made for operations of the prior-art disenabling circuit shown in FIG. 1 with reference to FIG. 2 of the drawings. When the power switch is turned off, all of the nodes N1, N2 and N3 and the positive voltage line 5 are in the ground level. If the power switch turns on at time t0, the positive voltage line 5 is gradually increased in voltage level. On the way to the positive voltage level Vcc, the positive voltage line 5 excesses the threshold voltage level Vth at time t1, then the p-channel type field effect transistors 2 and 7 and the n-channel type field effect transistor 4 turn on, but the p-channel type field effect transistor 3 remains in off-state to allow the node N1 to remain in the ground level, thereby causing the n-channel type field effect transistor 8 to be in the off-state. At time t2, the positive voltage line 5 excesses the voltage level two times larger than the threshold voltage Vth, then the p-channel type field effect transistor 3 turns on to allow the node N1 to follow the positive voltage line 5. However, if the node N1 excesses the threshold voltage Vth of the n-channel type field effect transistor 8 of the complementary inverter circuit 6 at time t3, the n-channel type field effect transistor 8 turns on but the p-channel type field effect transistor 7 turns off to change the output node N2 from the positive voltage level to the ground level. Then, the power-on disenable signal DE of the active high level has been produced from time t1 to time t3 at the output node N2. After time t3, all of the transistors 2, 3 and 4 remain in the respective on-states and, accordingly, allows the node N1 to have a positive voltage level Vcc-2Vth-Vp where Vp is a positive value.

However, a problem is encountered in the prior-art disenabling circuit in insufficient reduction in current consumption. This is because of the fact that the level detecting circuit 1 continues to provide a conduction path from the positive voltage after time t3.

SUMMARY OF THE INVENTION

It is therefore an important object of the present invention to provide a disenabling circuit which is reduced in current consumption.

To accomplish these objects, the present invention proposes to shift the n-channel type field effect transistor forming part of the level detecting circuit with the voltage level of the output node of the complementary inverter circuit.

In accordance with the present invention, there is provided a disenabling circuit operative to cause component circuits to shift into respective disenabling states for a predetermined time period after a power-on event, comprising: (a) a level detecting circuit provided with a series combination of plural load transistors of one channel conductivity type and at least one shifting transistor of the opposite channel conductivity type coupled between a power supplying line and a source of constant voltage, an output node thereof being provided between the plural load transistors and the shifting transistor; and (b) a complementary inverter circuit coupled at an input node thereof to the output node of the level detecting circuit and having an output node where a disenabling signal is produced, wherein the shifting transistor is responsive to the voltage level at the output node of the complementary inverter circuit.

BRIEF DESCRIPTION OF THE DRAWINGS

The features and advantages of a disenabling circuit according to the present invention will be more clearly understood from the following description taken in conjunction with the accompanying drawings in which.

DESCRIPTION OF THE PREFERRED EMBODIMENTS

First Embodiment

Figure 1:
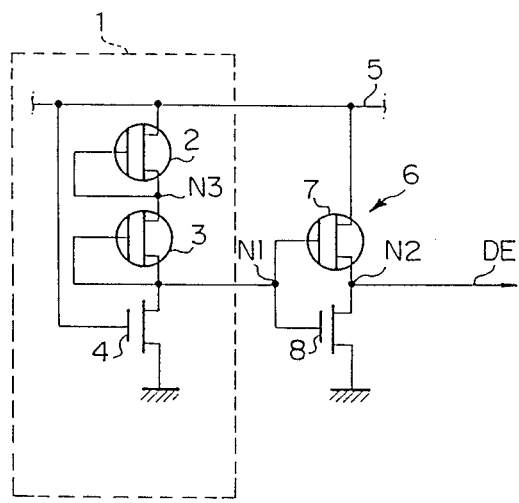
FIG. 1 is a diagram showing the circuit arrangement of a prior-art disenabling circuit for power-on event.
Figure 2:
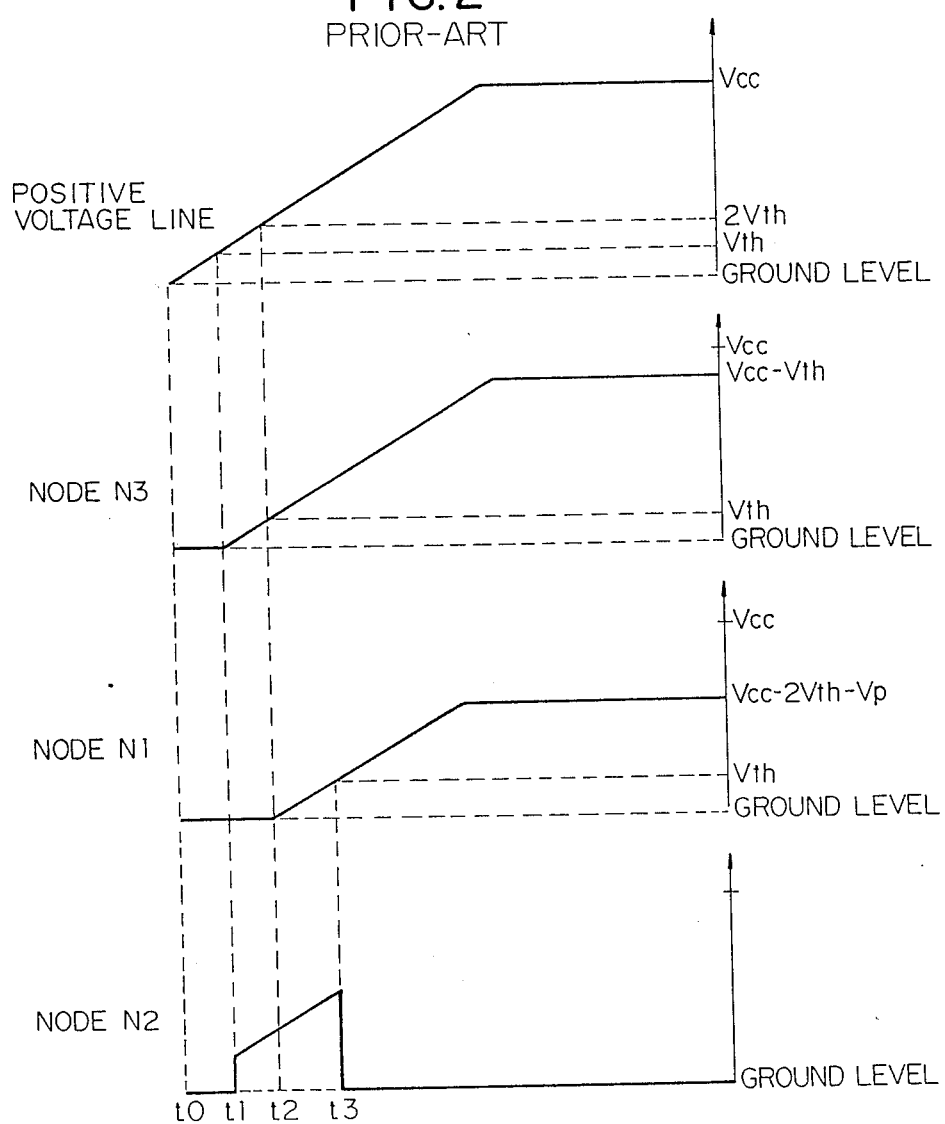
FIG. 2 is a graph showing the waveforms appearing at essential nodes of the prior-art disenabling circuit.
Figure 3:
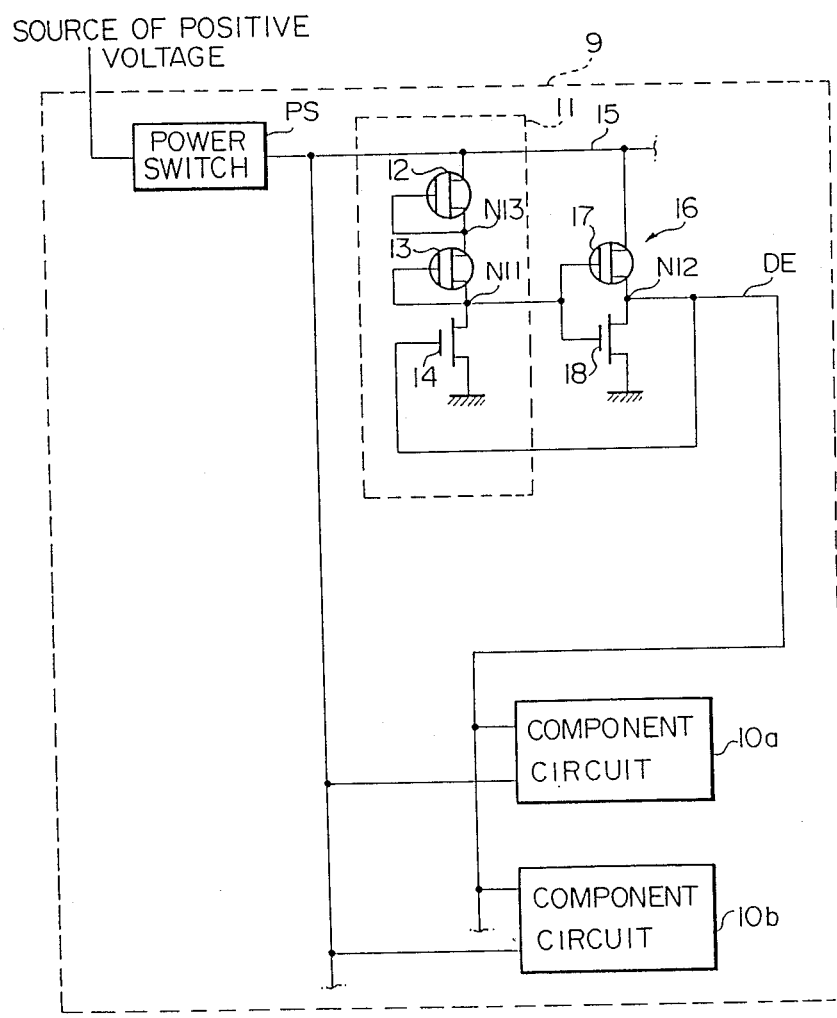
FIG. 3 is a diagram showing the circuit arrangement of a disenabling circuit embodying the present invention.

Referring first to FIG. 3 of the drawings, there is shown the circuit arrangement of a disenabling circuit which forms part of an integrated circuit fabricated on a semiconductor chip 9 together with component circuits 10a and 10b. The disenabling circuit comprises a level detecting circuit 11 provided with a series combination of two p-channel type field effect transistors 12 and 13 and an n-channel type field effect transistor 14 coupled between a positive voltage line 15, which is coupled to a source of positive voltage through a power switch PS, and a ground terminal, and a complementary inverter circuit 16 provided with a series combination of a p-channel type field effect transistor 17 and an n-channel type field effect transistor 18 coupled between the positive voltage line 5 and the ground terminal. When an integrated circuit remains in the stable state after a sufficient time from a power-on event, the positive voltage line 15 supplies all of the circuits incorporated in the integrated circuit with a positive voltage level Vcc. The level detecting circuit 11 has an output node N11 between the field effect transistors 13 and 14, and an output node N12 of the inverter circuit 16 is provided between the p-channel type field effect transistor 17 and the n-channel type field effect transistor 18. A power-on disenable signal DE takes place at the output node N12 which is supplied to the component circuits 10a and 10b. Each of the p-channel type field effect transistors 12 and 13 has a gate electrode coupled to a drain node thereof, and a gate electrode of the n-channel type field effect transistor 14 is coupled to the output node N12. The drain node of the p-channel type field effect transistor 2 is hereinunder referred to as a node N13. The p-channel type field effect transistors 12 and 13 have respective current driving capabilities ten times larger than the n-channel type field effect transistor 14 but respective threshold levels approximately equal in absolute value to the threshold level Vth of the n-channel type field effect transistor 14. Similarly, the p-channel type field effect transistor 17 has a threshold voltage level approximately equal in absolute value to the threshold voltage level Vth of the n-channel type field effect transistor 18.

Figure 4:
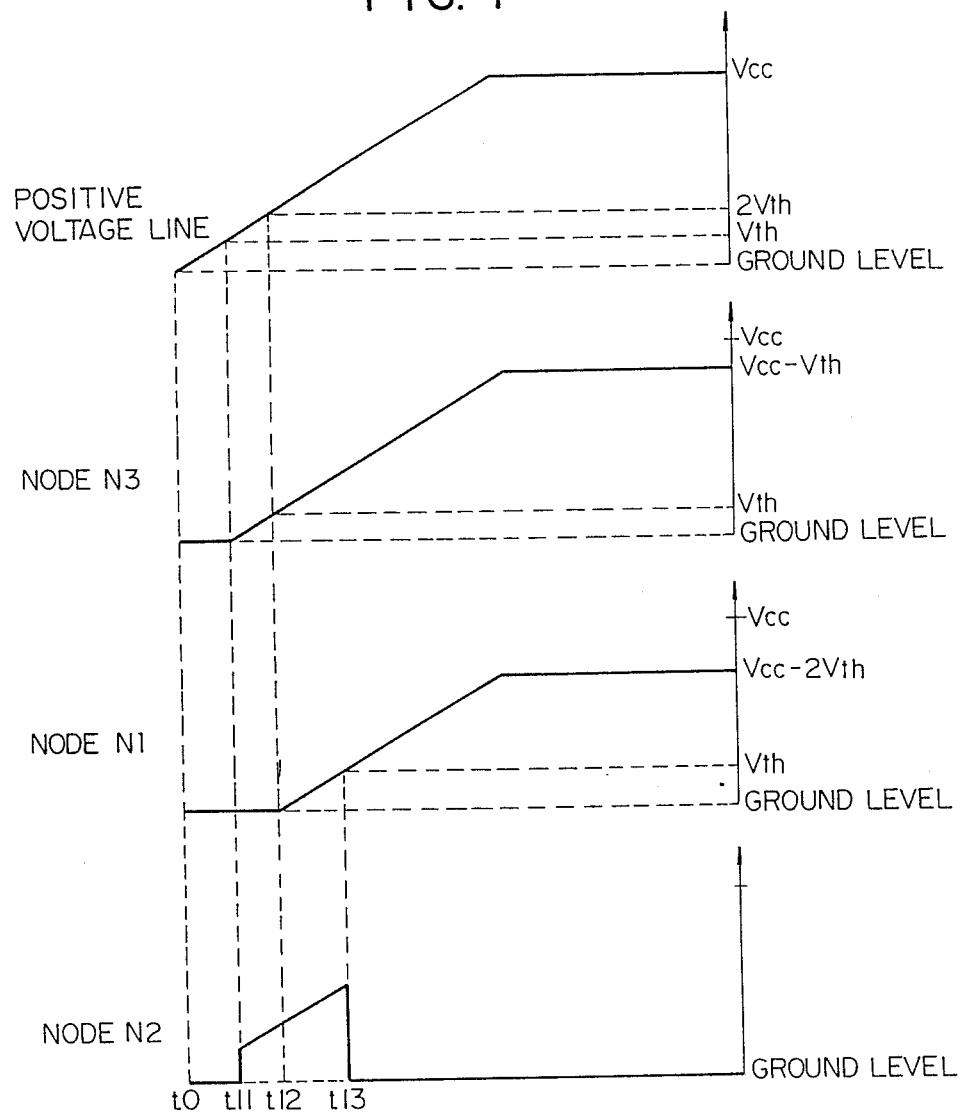
FIG. 4 is a graph showing the waveforms appearing at essential nodes of the disenabling circuit shown in FIG. 3.

Description is made for operations of the disenabling circuit shown in FIG. 3 with reference to FIG. 4 of the drawings. When the power switch PS is turned off, all of the nodes N11, N12 and N13 and the positive voltage line 15 are in the ground level. If the power switch PS turns on at time t0, the positive voltage line 15 is gradually increased in voltage level. On the way to the positive voltage level Vcc, the positive voltage line 15 excesses the threshold voltage level Vth at time t11, then the p-channel type field effect transistors 12 and 17 turn on, but the p-channel type field effect transistor 13 remains in off-state to allow the node N11 to remain in the ground level, thereby causing the n-channel type field effect transistor 8 to be in the off-state. However, a conduction path is established from the positive voltage line 15 to the output node N12 through the p-channel type field effect transistor 17, so that the output node N12 is increased in voltage level and finally reaches a voltage level approximately equal to that of the positive voltage line 15. For this reason, the n-channel type field effect transistor 14 turns on to clamp the node N11 at the ground level. At time t12, the positive voltage line 15 excesses the voltage level two times larger than the threshold voltage Vth, then the p-channel type field effect transistor 13 turns on to allow the node N11 to follow the positive voltage line 15. However, if the node N11 excesses the threshold voltage Vth of the n-channel type field effect transistor 18 of the complementary inverter circuit 16 at time t13, the n-channel type field effect transistor 18 turns on but the p-channel type field effect transistor 17 turns off to change the output node N12 from the positive voltage level to the ground level. Then, the power-on disenable signal DE of the active high level has been produced from time t11 to time t13 at the output node N12, and all of the component circuits 10a and 10b supplied with the power-on disenable signal DE remain inactive from time t11 to time t13, thereby preventing the component circuits 10a and 10b from undesirable functions. After time t3, the n-channel type field effect transistor 14 is turned off because the output node N12 goes down to the ground level, so that the conduction path between the positive voltage line 15 and the ground terminal is blocked by the n-channel type field effect transistor 14. As a result, no current is consumed in the level detecting circuit 11, and, accordingly, the power consumption is reduced during the operation of the integrated circuit.

Second Embodiment

Figure 5:
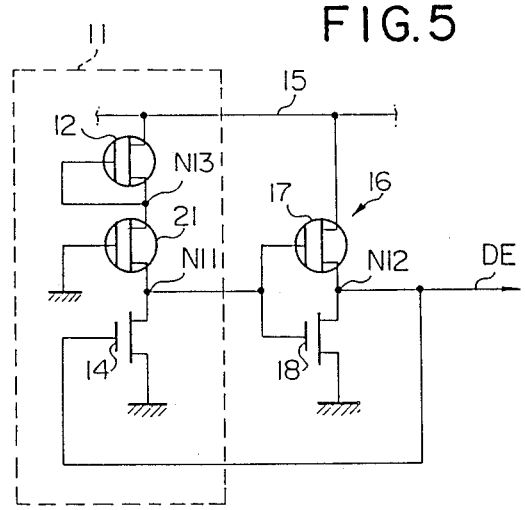
FIG. 5 is a diagram showing the circuit arrangement of another disenabling circuit according to the present invention.

Turning to FIG. 5 of the drawings, another disenabling circuit is illustrated. The disenabling circuit shown in FIG. 5 is similar in circuit arrangement to the disenabling circuit shown in FIG. 3 except for the connection of a p-channel type field effect transistor 21, and, for this reason, no further description is incorporated for the component transistors corresponding to those in the disenabling circuit illustrated in FIG. 3. The p-channel type field effect transistor 21 has a gate electrode coupled to the ground terminal, so that the p-channel type field effect transistor 21 serves as a resister. The node N11 follows the positive voltage line 15 with a small gap, and the node N11 allows the n-channel type field effect transistor 18 to turn off in an earlier stage.

Third Embodiment

Figure 6:
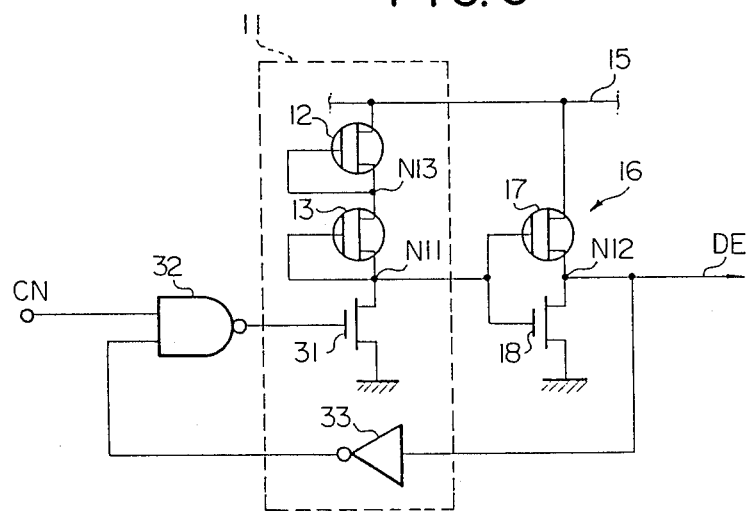
FIG. 6 is a diagram showing the circuit arrangement of still another disenabling circuit according to the present invention.

Turning to FIG. 6, there is shown still another disenabling circuit embodying the present invention. The disenabling circuit shown in FIG. 6 is similar in circuit arrangement to the disenabling circuit illustrated in FIG. 3 except for an n-channel type field effect transistor 31 and associated components. Then, transistors and circuits corresponding to those of the disenabling circuit shown in FIG. 3 are designated by like reference numerals, but no description is hereinunder incorporated for the sake of simplicity.

The n-channel type field effect transistor 31 is gated by a NAND gate 32, and two input nodes of the NAND gate 32 are coupled to a source of control signal CN and an inverter circuit 33 which in turn is coupled to the output node N12. The disenabling circuit thus arranged achieves not only the function implemented by the prior-art disenabling circuit but also the function carried out by the disenabling circuit illustrated in FIG. 3. Namely, if the control signal CN remains low, the NAND gate 32 produces a high level signal regardless of the inverse supplied from the inverter circuit 33, so that the n-channel type field effect transistor 31 is turned on even if the disenabling signal DE goes down to the ground level. On the other hand, if the control signal CN is shifted to the high level, the NAND gate 32 produces the output signal opposite in voltage level to the inverse from the inverter circuit 33. This is tantamount to application of the output node N12 to the gate electrode of the n-channel type field effect transistor 31. Then, the circuit behavior becomes to be similar to that described with reference to FIG. 4.

Although particular embodiments of the present invention have been shown and described, it will be obvious to those skilled in the art that various changes and modifications may be made without departing from the spirit and scope of the present invention.

What is claimed is:

1. A disenabling circuit operative to cause component circuits to shift into respective disenabling states for a predetermined time period after a power-on event, comprising:
   (a) a level detecting circuit provided with a series combination of plural load transistors of one channel conductivity type and at least one shifting transistor of the opposite channel conducitivity type coupled between a power supplying line and a source of constant voltage, an output node thereof being provided between said plural load transistors and said shifting transistor; and
   (b) a complementary inverter circuit coupled at an input node thereof to the output node of said level detecting circuit and having an output node where a disenabling signal is produced, wherein said shifting transistor is responsive to the voltage level at the output node of said complementary inverter circuit, and wherein said shifting transistor has a gate electrode directly coupled to the output node of said complementary inverter circuits and one of said load transistors has a gate electrode coupled to said constant source of voltage and in which the other load transistors have respective gate electrodes couples to respective drain nodes thereof.

2. A disenabling circuit operative to cause component circuits to shift into respective disenabling states for a predetermined time period after a power-on event, comprising:
   (a) a level detecting circuit provided with a series combination of plural load transistors of one channel conductivity type and at least one shifting transistor of the opposite channel conductivity type coupled between a power supplying line and a source of constant voltage, an output node thereof being provided between said plural load transistors and said shifting transistor; and
   (b) a complementary inverter circuit coupled at an input node thereof to the output node of said level detecting circuit and having an output node where a disenabling signal is produced, wherein said shifting transistor is responsive to the voltage level at the output node of said complementary inverter circuit, and wherein said shifting transistor is gated by a NAND gate having two input nodes one of which is supplied with a control signal and the other of which is coupled to an output node of an inverter circuit connected at an input node to the output node of said complementary inverter circuit.

3. A disenabling circuit as set forth in claim 2, wherein each of said load transistors has a gate electrode coupled to a drain node thereof.

* * * * *